(12) United States Patent
Box

(10) Patent No.: US 8,749,762 B2
(45) Date of Patent: Jun. 10, 2014

(54) LITHOGRAPHIC APPARATUS AND DEVICE MANUFACTURING METHOD

(75) Inventor: Wilhelmus Josephus Box, Eksel (BE)

(73) Assignee: ASML Netherlands B.V., Veldhoven (NL)

( * ) Notice: Subject to any disclaimer, the term of this patent is extended or adjusted under 35 U.S.C. 154(b) by 1427 days.

(21) Appl. No.: 10/842,636

(22) Filed: May 11, 2004

(65) Prior Publication Data

US 2005/0254028 A1 Nov. 17, 2005

(51) Int. Cl.
*G03B 27/58* (2006.01)
*G03B 27/52* (2006.01)
*G03F 7/20* (2006.01)

(52) U.S. Cl.
CPC .................. *G03F 7/707* (2013.01)
USPC .............................. 355/72; 355/30

(58) Field of Classification Search
CPC ...... G03F 7/707; G03F 7/7075; G03F 7/7085
USPC ............ 355/53, 72, 30, 75; 250/548; 361/234
See application file for complete search history.

(56) References Cited

U.S. PATENT DOCUMENTS

| | | | | | |
|---|---|---|---|---|---|
| 4,720,732 | A | * | 1/1988 | Tsutsui | 355/30 |
| 4,969,168 | A | * | 11/1990 | Sakamoto et al. | 378/34 |
| 5,231,291 | A | * | 7/1993 | Amemiya et al. | 250/443.1 |
| 5,329,126 | A | * | 7/1994 | Amemiya et al. | 250/453.11 |
| 5,997,963 | A | * | 12/1999 | Davison et al. | 427/582 |
| 6,033,478 | A | * | 3/2000 | Kholodenko | 118/500 |
| 6,226,073 | B1 | * | 5/2001 | Emoto | 355/53 |
| 6,496,350 | B2 | * | 12/2002 | Fujiwara | 361/234 |
| 6,628,503 | B2 | | 9/2003 | Sogard | |
| 6,664,549 | B2 | * | 12/2003 | Kobayashi et al. | 250/440.11 |
| 6,721,035 | B1 | * | 4/2004 | Segers et al. | 355/53 |
| 2001/0001248 | A1 | * | 5/2001 | Emoto | 355/53 |
| 2002/0101956 | A1 | * | 8/2002 | Hara et al. | 378/34 |
| 2002/0159217 | A1 | * | 10/2002 | Tsuruta et al. | 361/234 |
| 2003/0127605 | A1 | * | 7/2003 | Kondo | 250/492.2 |
| 2003/0234366 | A1 | * | 12/2003 | Basch et al. | 250/393 |

FOREIGN PATENT DOCUMENTS

| | | |
|---|---|---|
| JP | 04-048716 | 2/1992 |
| JP | 04-085918 | 3/1992 |
| JP | 04-208551 | 7/1992 |
| JP | 07-263526 | 10/1995 |
| JP | 09-270457 A | 10/1997 |

(Continued)

OTHER PUBLICATIONS

English Translation of Notification of Reason(s) for Refusal as issued for Japanese Patent Application No. 2005-136983, dated Jul. 14, 2009.

(Continued)

*Primary Examiner* — Hung Henry Nguyen

(74) *Attorney, Agent, or Firm* — Pillsbury Winthrop Shaw Pittman LLP

(57) ABSTRACT

A lithographic apparatus includes an illumination system to provide a beam of radiation, a support to support a patterning devices, the patterning devices configured to impart the beam with a pattern in its cross-section, a substrate table to hold a substrate, a projection system to project the patterned beam onto a target portion of the substrate, and a conditioning system to condition the substrate. The conditioning system conditions a non-target portion of the substrate with a conditioning fluid. A method of manufacturing a device includes conditioning a non-target portion of a substrate.

24 Claims, 8 Drawing Sheets

(56) References Cited

FOREIGN PATENT DOCUMENTS

| | | |
|---|---|---|
| JP | 10-214782 A | 8/1998 |
| JP | 2000-031253 | 1/2000 |
| JP | 2004-503924 | 2/2004 |
| WO | 2004/053955 | 6/2004 |

OTHER PUBLICATIONS

Japanese Office Action dated Apr. 23, 2013 in corresponding Japanese Patent Application No. 2011-196766.
Japanese Office Action dated Oct. 19, 2010 in corresponding Japanese Patent Application No. 2010-003632.
Japanese Office Action dated May 17, 2011 in corresponding Japanese Patent Application No. 2010-18284.

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one, or several, dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

In lithographic apparatuses the size of features that can be imaged on to the wafer is limited by the wavelength of the projection radiation. As shorter wavelengths are used in order to be able to image smaller features, the dosage of the radiation increases, since the energy of the radiation is indirectly proportional to its wavelength. It has been found that conventional lithographic apparatuses suffer from the drawback that the dosage of the radiation causes the wafer to heat up on both a local and a global scale. Typically, the lithographic apparatus carries out a series of steps in order to form a sequence overlapping patterns on the wafer. One consequence of the wafer heating up is that overlay problems arise, that is errors are caused by overlay errors between the different layers of patterns on the wafer. It has further been found that for large radiation dosages, such as those typically encountered in lithographic apparatuses operating in the ultraviolet, deep ultraviolet, extreme ultraviolet and shorter wavelengths, wafer heating errors are becoming a contributing factor to the total overlay error. Further, conventional techniques for cooling wafers, for example, as described in U.S. Pat. No. 5,220,171, do not address the problem of local wafer heating.

In particular, it has further been found that due to the relative high thermal resistance of the wafer table and contact resistance of the wafer to wafer table and the wafer table to the exposure chuck, local conditioning remains a problem in conventional lithographic apparatuses. It has further been found that a major problem with respect to wafer heating in general, is to getting the heat out of the wafer fast enough. It has been found that good thermal conditioning of portions of the wafer table, for example, the mirror block, in conventional apparatuses only gives a small effect because of the poor thermal conduction of the wafer table material.

SUMMARY OF THE INVENTION

It is an aspect of the present invention to address the problems encountered in conventional lithographic apparatuses. It is a further aspect of the present invention to address the problem of overlay errors. It is a yet further aspect to improve the conditioning of the wafer, in particular, its thermal conditioning. It is a yet further aspect to improve the local wafer conditioning.

It is yet a further aspect of the present invention to improve the speed with which the wafer is cooled. According to an aspect of the invention, there is provided a lithographic apparatus comprising an illumination system constructed to provide a projection beam of radiation; a support structure constructed to support a patterning device, the patterning device serving to impart a cross-section of the projection beam with a pattern to form a patterned beam; a substrate table constructed to hold a substrate; a projection system that projects the patterned beam onto a target portion of the substrate; and a conditioning system constructed to directly condition a non-target portion of the substrate with a conditioning fluid.

In this way, local wafer heating is reduced resulting in an improvement in the overlay performance.

In an exemplary embodiment, the conditioning fluid is a coolant capable of cooling the substrate. In this way, cooling of the substrate is achieved in an efficient manner.

In an exemplary embodiment, the conditioning fluid is arranged to come into contact with the substrate.

In an exemplary embodiment, the conditioning system includes at least one conditioning fluid supply element constructed to transport a conditioning fluid to a surface of the substrate. In particular, the at least one conditioning fluid supply element includes at least one hole formed in a surface of the substrate table, wherein the at least one hole is in fluid connection with a supply of conditioning fluid. By providing holes in the substrate table for supplying a conditioning fluid, the conditioning fluid is supplied in a more efficient manner since it is supplied most efficiently to the substrate, which is the component requiring the most conditioning.

In an exemplary embodiment, the number of holes provided for supplying conditioning fluid lies within the approximate range of around 200 holes/m$^2$ to around 113000 holes/m$^2$ of substrate table. By providing a hole density in the preferred range improved conditioning is achieved without compromising the performance of the substrate table and without introducing vibrations into the lithographic apparatus.

In a yet further exemplary embodiment, the number of holes provided lies within the approximate range of around 14000 holes/m$^2$ to around 57000 holes/m$^2$. In this way, yet further improved results are achieved in terms of conditioning while minimizing impact on the performance of the lithographic apparatus.

In an exemplary embodiment, the cooling system includes at least one conditioning fluid removal element constructed to transport a conditioning fluid away from a surface of the substrate. In particular, the conditioning fluid removal element includes at least one hole formed in a surface of the substrate table, wherein the at least one hole is in fluid connection with a reservoir of the conditioning fluid to receive the conditioning fluid. Further, the total area of holes formed in the substrate table for removing the conditioning fluid from the substrate may be substantially the same as the total area of holes formed in the substrate table for supplying the conditioning fluid to the substrate. In this way, the conditioning fluid is both efficiently supplied removed to and from the substrate without causing any flow induced vibrations in the lithographic apparatus.

In an exemplary embodiment, the conditioning fluid is a coolant capable of cooling the substrate. In particular, the fluid is a gas, such as air or a liquid such as water. Since, in particular, air and water cooling systems are provided to cool other components of the lithographic apparatus, the conditioning system may be provided without adding substantial complexity to the lithographic apparatus.

In an exemplary embodiment, the flow rate of the gas lies in the range of approximately 3 to 150 m$^3$ per hour. In this way, efficient conditioning is achieved without causing dynamical disturbances to the lithographic apparatus, in particular, to the substrate or the substrate table, including the chuck (otherwise referred to as the mirror block, which forms part of an interferometric device for determining the position of the substrate table).

In an exemplary embodiment, the flow rate of the liquid lies in the range of approximately 0.003 to 6 liters per minute. In this way, for a liquid conditioned substrate, efficient conditioning is achieved without causing dynamical disturbances.

In an exemplary embodiment, in a gas conditioned system, the hole for supplying the gas to the substrate is nozzle shaped to increase the heat transfer of the conditioning fluid supplied to the substrate. In this way, the efficiency of the conditioning is further increased.

In an exemplary embodiment, the non-target portion of the substrate includes an area disposed on a backside of the substrate, the backside being disposed opposite a side of the substrate on which the target portion is located, wherein the fluid conditions the backside of the substrate. In this way, effective conditioning is achieved without affecting the exposure.

According to a further aspect of the invention, there is provided a method of manufacturing a device including providing a substrate; projecting a patterned beam of radiation onto a target portion of the substrate; and conditioning a non-target portion of the substrate with a conditioning fluid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning devices, the support structure may be a frame or table, for example, which may be fixed or movable as needed and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Exemplary embodiments of the present invention will now be described, by way of example only, with reference to the accompanying schematic drawings in which corresponding reference symbols indicate corresponding parts, and in which.

Like reference symbols in the various figures indicate like elements.

DETAILED DESCRIPTION

Figure 1:
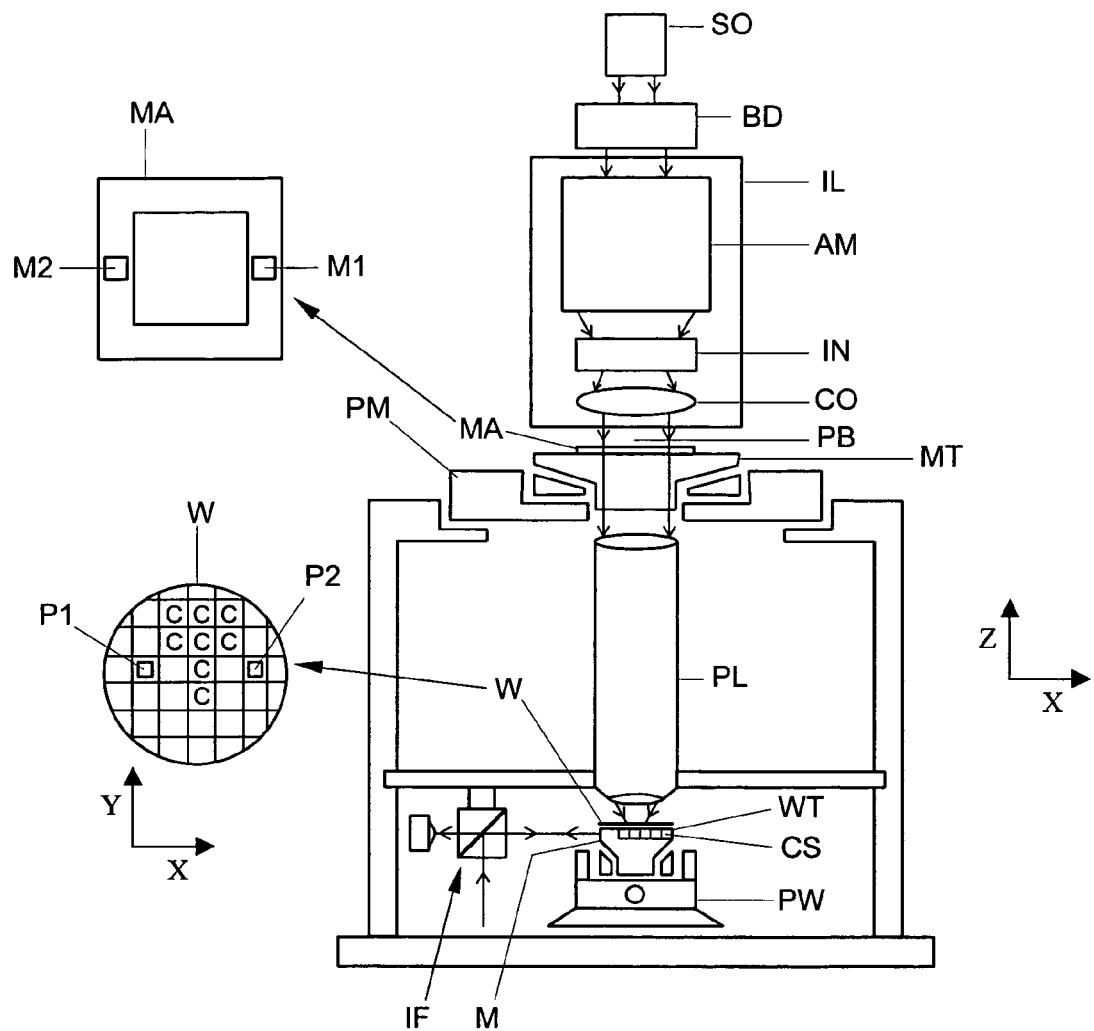
FIG. 1 depicts a lithographic apparatus according to an exemplary embodiment of the present invention.

FIG. 1 schematically depicts a lithographic apparatus according to an exemplary embodiment of the present invention. The apparatus includes an illumination system (illuminator) IL configured to provide a beam PB of radiation (e.g. UV radiation, deep ultra violet (DUV) or extreme ultra violet (EUV) radiation). A first support (e.g. a mask table) MT is configured to support a patterning device (e.g. a mask) MA and is connected to a first positioning device PM that accurately positions the patterning device with respect to a projection system ("lens") PL. A substrate table (e.g. a wafer table) WT is configured to hold a substrate (e.g. a resist-coated wafer) W and is connected to a second positioning device PW that accurately positions the substrate with respect to the projection system PL. The projection system (e.g. a refractive projection lens) PL images a pattern imparted to the beam PB by the patterning device MA onto a target portion C (e.g. including one or more dies) of the substrate W. The substrate further includes a non-target portion on which the projection beam is not incident. The substrate typically includes a side on which the target portion is located and a backside which is disposed opposite the side on which the target portion is located. The non-target portion of the substrate includes an area disposed on a backside of the substrate. In addition, however, the non-target portion may also include an area on the side on which the target portion is disposed. For example, the substrate extends in a zone in which the target portion is disposed beyond the extent of the target portion. Those areas extending beyond the target portion are also included in the non-target portion.

As here depicted, the apparatus is of a transmissive type (e.g. employing a transmissive mask). Alternatively, the apparatus may be of a reflective type (e.g. employing a programmable mirror array of a type as referred to above).

The illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example when the source is a mercury lamp. The source SO and the illuminator IL, together with the beam delivery system BD if needed, may be referred to as a radiation system.

The illuminator IL may include an adjuster AM that adjusts the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB having a desired uniformity and intensity distribution in its cross-section.

The beam PB is incident on a patterning device, illustrated in the form of the mask MA, which is held on the mask table MT. Having traversed the mask MA, the projection beam PB passes through the projection system PL, which focuses the beam onto a target portion C of the substrate W. With the aid of the second positioning device PW and a position sensor IF (e.g. an interferometric device), the substrate table WT can be moved accurately, e.g. so as to position different target portions C in the path of the beam PB. Further, the substrate table WT may be provided with a mirrored surface M which forms part of the interferometric device. The mirrored surface M is described in more detail with reference to FIG. 2. Similarly, the first positioning device PM and another position sensor (e.g., an interferometric device which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Further shown in FIG. 1 is a conditioning system CS configured to condition the non-target portion of the substrate with a conditioning fluid. According to an exemplary embodiment of the invention, a fluid, for example air or water, is flowed on the underside or backside of the substrate, that is the surface of the substrate opposite a surface arranged to receive the projection beam PB. The fluid may be thermally conditioned to cool the substrate. In particular, the backside of the substrate is conditioned by the thermally conditioned fluid. The fluid may be supplied to the substrate so that it comes in contact with the surface of the substrate.

Figure 2:
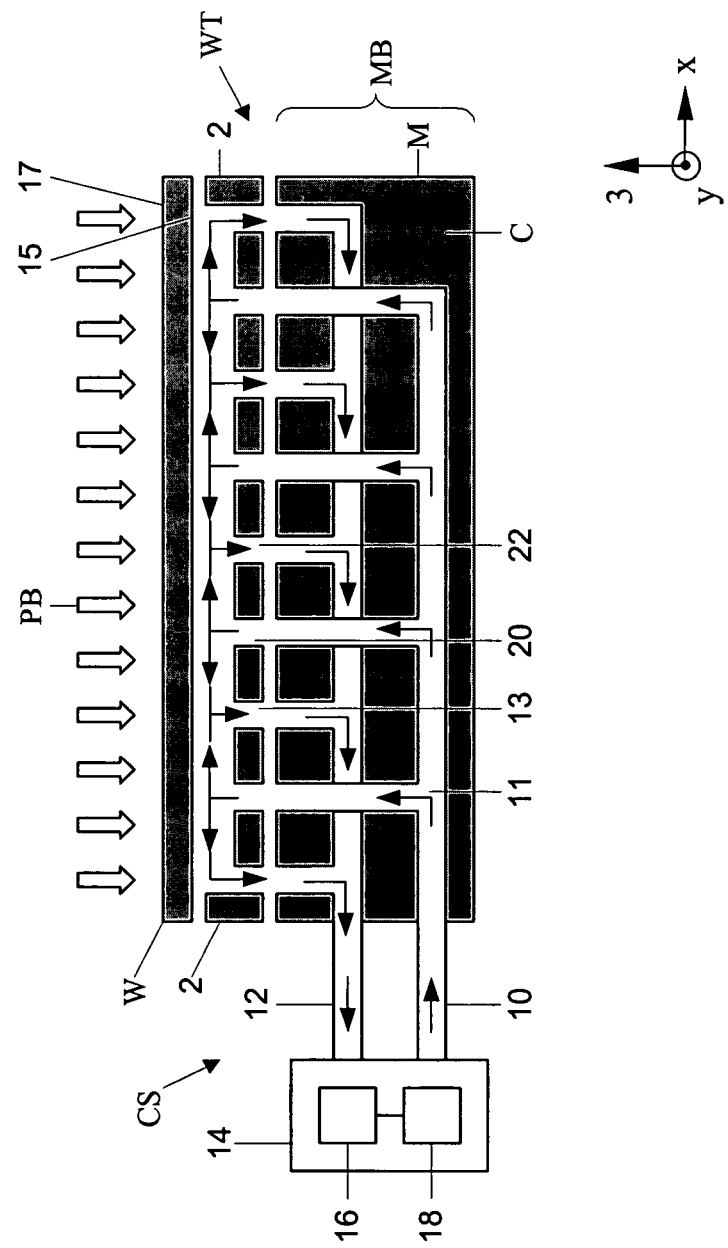
FIG. 2 depicts details of the lithographic apparatus according to an exemplary embodiment of the present invention.

FIG. 2 depicts details of the lithographic apparatus according to an exemplary embodiment of the present invention. FIG. 2 shows a substrate table WT and a conditioning system CS configured to condition the substrate W. The conditioning system CS is a thermal conditioning system. In an exemplary embodiment, the substrate table WT extends substantially in a plane lying at an angle to a direction of propagation of the beam PB, and the substrate W is supported by the substrate table WT substantially in the plane. The substrate has first and second opposing surfaces 17, 15, also referred to as the top side 17 and backside 15 of the substrate respectively, wherein the first surface 17 is arranged to receive the beam PB at least one of the second surface 15 and the first surface 17 is arranged to be directly conditioned, for example, cooled by the conditioning system CS. The conditioning system is configured to condition a non-target portion 15, 17 of the substrate with a conditioning fluid. Further, in the direction of propagation of the beam PB, the second surface 15 is arranged downstream of the first surface 17. The conditioning system CS is configured to directly condition at least one of a backside 15 of the substrate and a top side 17 of the substrate.

The substrate table WT may include a surface 2 to receive the substrate W. It may also further include a substrate holder C to hold the substrate during processing. The substrate holder C may be a chuck, for example a vacuum chuck to hold the substrate using a vacuum. Alternatively, the chuck may hold the substrate electrostatically. In FIG. 2 a vacuum chuck is shown. In order to determine the position of the chuck an outer surface M of the chuck is provided with reflective areas M, for example mirrors. The mirrors M form part of an interferometric device IF to determine the position of the chuck C. The chuck may also be referred to as the mirror block MB, as for example, depicted and described with reference to FIG. 3.

In FIG. 2 direct substrate or wafer conditioning is provided, preferably on the second surface, or backside, 15 of the wafer. The second surface 15 of the wafer, opposite to the first surface 17 of the wafer configured to receive the beam PB, is conditioned. The conditioning is achieved by bringing a thermally conditioned fluid, for example, a gas such as air or a liquid such as water or a gas/liquid mixture, into contact with a surface 15 of the wafer W. In an exemplary embodiment, thermally conditioned air may be supplied towards the wafer chuck. In an alternative embodiment, environmental air may be sucked in and flow via the backside of the wafer onto the backside of the wafer towards the wafer table and chuck towards a vacuum pump An air inlet may be provided in the wafer table or the wafer chuck through which air the conditioning air is introduced. In a lithographic apparatus, air showers may be provided for conditioning certain components. In one embodiment, the environmental air which is sucked in may be sucked in from the air showers, in which case it is thermally well conditioned. Alternatively, or in addition, at least one of the chuck and wafer table may be thermally conditioned so that the air becomes thermally conditioned by virtue of flowing across it. In the embodiment shown in FIG. 2, a vacuum is provided in order to hold the wafer W in position. In comparison to conventional lithographic apparatuses, the amount of vacuum needed is increased because the vacuum used to hold the wafer is offset by the supply 10, 11 of air to the wafer W. The coolant is supplied to the wafer W via a fluid supply 10 and by at least one supply channel 11. The coolant is removed from the backside of the wafer W via at least one removal channel 13 and a fluid outlet 12. Certain properties of the fluid supplied to the wafer W are controlled by a control unit 14. The control unit may include a thermal conditioning unit 16 to thermally condition the fluid to be supplied to the wafer W. In particular, the thermal conditioning unit includes a system for thermally conditioning the fluid to be supplied so that it is at a desired temperature to thermally condition of the wafer W. Depending on the stage of the exposure it may be necessary to heat the fluid. For example, at the beginning, before exposure has begun, the wafer may be both too cold when it is placed on the wafer table. During exposure however, the wafer will be heated by the radiation, in which case, as exposure progresses, it may be necessary to thermally condition the fluid so that the wafer is cooled by the fluid. The fluid supply 10 and the fluid outlet 12 are provided in good thermal contact with the thermal conditioning unit 16. The control unit 14 may further include a supply controller 18 for controlling certain other properties of the fluid, for example, flow rate, pressure. The supply controller 18 may further control the vacuum applied to the chuck in order to hold the wafer W in position during processing and during conditioning of the wafer W. Typically, the vacuum needed to hold the wafer in place, Pvac, is approximately 0.5 bar. Due to the necessary vacuum under the wafer W, any extra air may be supplied at low pressure. The supply of air, or other fluid depending on the embodiment, to the backside of the wafer W may further be controlled by varying the number and dimensions of supply holes 20 and removal holes 22. The holes 20, 22 are typically small in comparison to the surface area of the wafer W. In this way, the pressure of the fluid supplied to the wafer is controlled. In particular, in an embodiment where the fluid is a gas, it has been found that if the holes are provided in a form of a nozzle, that is the outflow velocity is increased by providing a smaller outflow area, the conditioning of the wafer W is improved. In particular, the control unit 14 controls the supply and removal of fluid so that dynamical disturbances of the chuck C and the wafer W are suppressed. This is achieved by controlling the flow parameters, such as flow rate, as described below in further detail.

In order to determine the number of holes 20, 22 needed for conditioning a wafer W, the following calculations based on the following assumptions were carried out: a high exposure dose is typically 235 mJ/cm$^2$, assuming a wafer W including 50 dies of 26×32 millimeters, the throughput is 84 wafers per hour, the reticle transmission is 63%. Thus, A_wafer_exp=50×2.6×3.2=416 cm$^2$, where A_wafer_exp is the exposed area of the wafer, or Q_wafer_exp=A_wafer_exp×dose×reticle transmission=416×235×0.63=62×10³ mJ, where Q_wafer_exp is the energy received by the exposed area of the wafer.

Further, the time period during which the wafer is exposed, T_wafer=3600/84=43 s (where 3600 is equal to the number of seconds in an hour). Thus, dQ/dt_wafer=62/43=1.44 Watts, where dQ/dt is the power received by the exposed area of a wafer.

According to an exemplary embodiment of the present invention, the power supplied to the wafer during exposure is cooled by air. Whereas in conventional uncooled lithography machines the wafer may heat up by 2.4 Kelvin, in a cooled apparatus, the maximum heat up of the air is desired to be 0.1 Kelvin.

In order to determine the mass of air per second, dm/dt_air, needed to flow in order to cool the wafer so that the temperature of the air rises by a maximum of 0.1K, the following calculation is carried out:

dQ/dt_air=dQ/dt_wafer=dm/dt_air×Cp_air×dT_air, or 1.44=dm/dt_air×1012×0.1, where dQ/dt_air is the amount of power to be absorbed by the air, Cp_air is the specific heat capacity of air at constant pressure and is equal to 1012 J/kgK, and dT_air is the maximum change in the temperature of the air.

The above equation may be rearranged to give: dm/dt_air=14×10⁻³ kg/s.

Since the pressure of the air, P_air, is equal to 0.5 bar, the density of air, rho_air, is equal to approximately 0.6 kg/m³, the rate of volume flow or air needed, dV/dt_air, or dV/dt_air=14×10⁻³/0.6=23×10⁻³ m³/s.

In order to determine the total area of holes needed in the wafer table WT, A_req, in order to deliver the above calculated volume of air per second without causing vibrations within the apparatus due to the flow of air, a maximum air speed, v_max, of 10 meters/second is set. Thus, A_req=dV/dt_air/v_max=23×10⁻³/10=2.3×10⁻³ m².

In an exemplary embodiment, the diameter of the holes is 1.2 mm. Thus, the area of a single hole, A_hole is calculated as follows:

A_hole=(π/4)×(1.2×10⁻³)²=1.13×10⁻⁶ m². Thus, the number of holes needed to provide the desired air flow, n_holes, is determined by n_holes=A_req/A_hole=2.3×10⁻³/1.13×10⁻⁶=2035.

It has been found, as determined by geometry that up to approximately 8000 holes may be formed in the substrate table without causing adverse effects such as a loss of functionality with respect to the substrate positioning and stiffness. In an exemplary embodiment up to approximately 4000 holes may be formed in the substrate table in order to facilitate the supply of the cooling fluid to the substrate. It has been found that for fluids having superior heat transfer properties to that of air, for example water and other liquids, the number of holes needed can be reduced.

In the exemplary embodiment described above, the diameter of the wafer, D_wafer, is 0.3 meters. Therefore, the area of the wafer table, A_table, is π/4 (0.3)², that is 0.071 m².

Thus, for example, for direct gas conditioning, the hole density in the wafer table may vary from about 14000 holes/m² to around 113000 holes/m². In a further embodiment, the hole density is from about 14000 holes/m² to around 57000 holes/m².

As mentioned for a direct liquid, such as water conditioning, the hole density needed is less. It has been found that a significant reduction is already achieved with a minimum number of holes being one, if a low water flow is used. Thus, for the size of holes calculated above, the minimum hole distribution of 14 holes per meter squared is possible. However, this value will vary depending on the area of the holes used which may also vary. In an exemplary embodiment, the number of holes may be approximately 30, which corresponds to a hole density of approximately 420 holes per meter square. In an exemplary embodiment, for a water conditioned cooling system, the hole density in the wafer table varies from about 200 holes per meter square.

While in the embodiment described above, certain parameters, are assigned predefined values, it should be appreciated that these predefined values may vary. In such cases, other parameters dependent on the predefined parameters will also vary accordingly.

It has been found in simulations that using an air flow to directly condition the wafer, results in a decrease in global wafer temperature of a factor 2 to 3. Further, the maximum wafer heating is decreased by approximately 20%. To achieve these results, it has been found that a relatively high air flow, that is of the region of 12 to 60 m³/hr, and nozzle outflow is needed.

In simulations, it has further been found that using a water flow to directly condition the wafer, the decrease in global wafer temperature is a factor 4 to 10 and a factor 2 to 3 for the maximum wafer temperature for relatively small water flows, that is of the region of 0.003 to 0.3 liters/min.

It has been found that water flow decreases the wafer heating phenomena.

Figure 3:
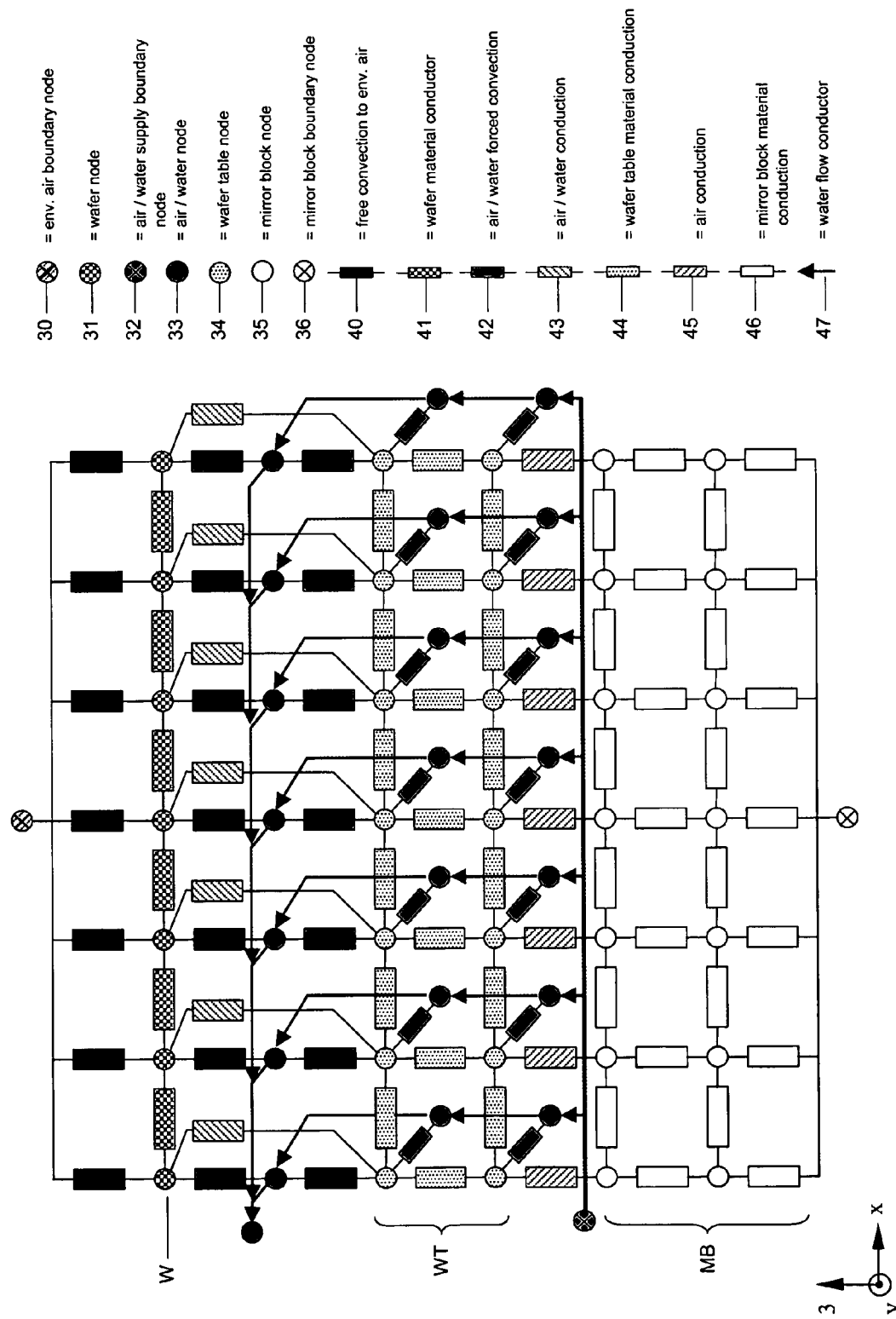
FIG. 3 depicts a two dimensional illustration of a three dimensional model used in a computer simulation for calculating the wafer conditioning.

FIG. 3 depicts a two dimensional illustration of a three dimensional model used in a simulation for calculating the wafer conditioning according to embodiments of the present invention.

The calculations were done using a thermal network analysis program TAK3. The model is shown schematically in FIG. 3. For modeling simplicity the wafer in the calculation is square using 7×7=49 wafer nodes. Every wafer node 31 is regarded as one die. Below the wafer nodes 31 the same node layout is used for: water or air nodes 33; wafer table nodes 34 (divided in two vertical sections to account for temperature non-uniformity in z-direction); mirror block nodes 35 (two vertical sections and next a boundary node).

In addition, an environmental air boundary node 30, an air/water supply boundary node 32 and a mirror block boundary node 36 are provided.

The nodes 30-36 in the model are connected by in plane and vertical conductors 40-47 of the materials of the wafer W, which may be typically made of silicon, wafer table WT and mirror block MB. The wafer table WT and mirror block MB/C may be made of a material having a low coefficient of thermal expansion. Materials include glass materials such as ZERODUR® which has an extremely low coefficient of thermal expansion or other materials, such as Cordurite. In particular, in the model, the nodes 30-36 are connected with the following conductors: free convention to the environmental air 40, wafer material conductor 41, air/water forced convection 42, air/water conduction 43, wafer table material conduction 44, air conduction 45, mirror block material conduction 46 and water flow conductor 47. The water or air cooling flow in the model first goes through the holes 20 in the wafer table WT, then flows between the wafer W and wafer table WT and then flows out through holes 22 as shown in FIG. 2. The forced convection of the medium through the holes 20 in the wafer table WT is not included in the air cooling calculations, only in the water calculations. The forced convection was included to see if it had any effect on the heat up of the wafer table WT. The simulation showed that the effect was negligible. Therefore, the model was not adapted to account for the forced convection of the medium for air. Furthermore in practice, the fluid flow may be through the mirror block MB/C and after direct wafer cooling back through the wafer table WT and mirror block MB/C. It is assumed that this model simplification has also in this case a negligible effect on the results.

In FIG. 3 the model is depicted as a two dimensional model (e.g. 1×7 nodes for the wafer), the actual model used in the simulation has 7×7 nodes and conductors both in X and Y-direction.

The following value is taken for the illumination dose at the wafer: 249 mJ/cm$^2$, which is a typical high illumination dose for a lithography apparatus.

When air is used as cooling medium a minimum amount of holes is needed to limit the air velocity since this may otherwise result in flow induced vibrations. Furthermore, preferably, pressure losses are to be limited. The hole diameters and number of holes 20 needed for supply of the medium (the return holes 22 not included) are listed for both air and water in Table 1.

TABLE 1 hole diameters and number of holes for supply (the return holes 22 are not shown in Table 1)

| Medium | hole diameter [mm] | min. number of holes needed for supply | number of supply holes in analysis |
|---|---|---|---|
| Air | 1.2 | 2100 | NA |
| Water | 1.2 | 31 | 49 |

As shown in FIG. 2 the outflow of air from the wafer table WT towards the wafer W can be simply out of the holes 20. However, in an alternative embodiment, to increase the heat transfer of the air to the wafer W, a locally smaller outflow opening is provided, for example, in the form of a nozzle, at the wafer table WT. This nozzle effect will result in small air jets giving a much higher heat transfer coefficient. The air flow settings, the air velocities and resulting forced convection heat transfer coefficients are all listed in Table 2, for both situations: with and without nozzle. For higher air flows the nozzle diameter has to be increased, to prevent the air flows at the sound of speed through the nozzle. The flow settings for the water and the resulting water velocity and heat transfer coefficients are in Table 3.

The remaining model parameters were set to reflect typical values in a lithography apparatus, in order to provide the most accurate model.

TABLE 2

Air flow settings

| | | | normal out flow | | | | nozzle flow | |
|---|---|---|---|---|---|---|---|---|
| $\phi_m$ [kg/s] | $\phi_V$ [m$^3$/hr] | $V_{air\ through\ hole}$ [m/s] | $V_{air\ under\ wafer}$ [m/s] | $hc_{air\ under\ wafer}$ [W/m$^2\cdot$K] | $D_{nozzle}$ [mm] | $V_{air\ through\ nozzle}$ [m/s] | $hc_{air\ under\ wafer}$ [W/m$^2\cdot$K] |
| 0.005 | 30 | 3.5 | 0.9 | 449 | 0.2 | 126 | 1.9e3 |
| 0.010 | 60 | 7 | 1.8 | 449 | 0.2 | 253 | 2.5e3 |
| 0.015 | 90 | 10.5 | 2.7 | 449 | 0.22 | 314 | 2.7e3 |
| 0.020 | 120 | 14 | 3.6 | 449 | 0.25 | 323 | 2.5e3 |
| 0.025 | 150 | 18 | 4.6 | 449 | 0.3 | 281 | 2.1e3 |

TABLE 3

Water flow settings

| $\phi_m$ [kg/s] | $\phi_V$ [l/min] | $V_{air\ through\ hole}$ [m/s] | $V_{air\ under\ wafer}$ [m/s] | $hc_{air\ under\ wafer}$ [W/m$^2\cdot$K] |
|---|---|---|---|---|
| 0.00005 | 0.003 | 8.9e-4 | 3.5e-5 | 1e4 |
| 0.0001 | 0.006 | 1.8e-3 | 7.1e-5 | 1e4 |
| 0.001 | 0.06 | 0.18 | 7.1e-4 | 1e4 |
| 0.005 | 0.3 | 0.089 | 3.5e-3 | 1e4 |
| 0.01 | 0.6 | 0.18 | 7.1e-3 | 1e4 |
| 0.05 | 3.0 | 0.89 | 0.035 | 1e4 |
| 0.1 | 6.0 | 1.8 | 0.071 | 1e4 |

It is noted that the notation XeY given in the tables, where X is a positive numerical value and Y may be a positive or negative integer, is equivalent to the notation X×10$^Y$.

The results of the simulation are shown in FIGS. 4-11. In particular, the results show that the direct wafer cooling decreases, in particular, the global heat up of the wafer and local heat up at the expose location. While the results below refer to the model as described hereinabove, the parameters derived from the model have application to real lithographic apparatuses. In this way, the embodiments of the present invention are derived from the modeled results.

Figure 12:
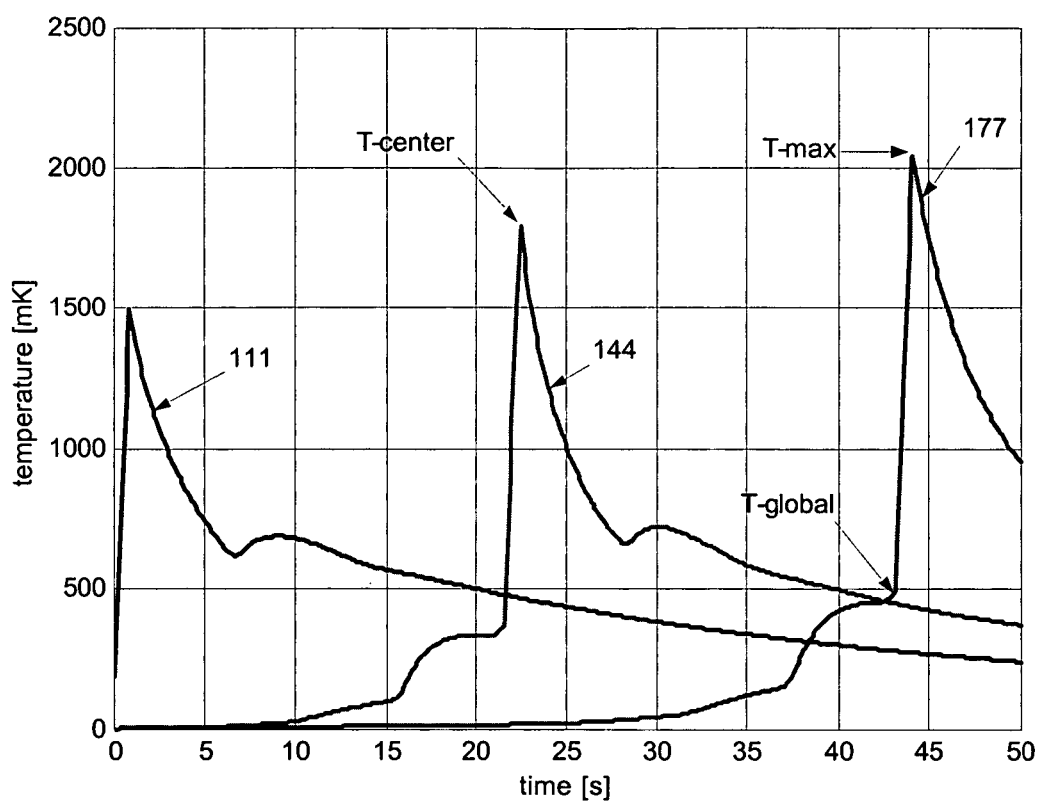
FIG. 12 depicts the temperature at different locations on the wafer, in particular at the first exposure location, the center location of the wafer and the location on the wafer at the last exposure, as a function of time for a conventional lithographic apparatus.

FIG. 12 depicts the temperature at different locations on the wafer, in particular at a first exposure location (111), a center location of the wafer (144) and a location on the wafer at the last exposure (177), as a function of time for a conventional lithographic apparatus. FIG. 12 is provided to illustrate a comparison with the conventional lithographic apparatus with respect to an apparatus cooled in accordance with embodiments of the present invention.

FIG. 12 depicts the effect of air flow on the mean wafer temperature without conditioning. In FIG. 12 the temperature at the wafer W is shown as function of time for three locations 111, 144, 177.

With respect to FIGS. 4-12, the identifiers for each location represent a coordinate in the model having the following notation: -ZXY. Thus, locations having coordinates 1XY refer to locations on the wafer, locations having the coordinates 2XY refer to locations on the underside of the wafer, locations having coordinates 3XY refer to locations on the top of the wafer table WT, locations having the coordinates 4XY refer to locations on the bottom of the wafer table WT, locations having the coordinates 5XY refer to locations on the top side of the mirror block MB and locations having the coordinates 6XY refer to locations in a mid region of the mirror block MB. The locations in the X and Y direction may take values 1-7, respectively, and refer to locations in the X-Y plane in the conventional manner. In FIG. 3, Location 111 is the location of the first exposure, 144 is at the center of the wafer, location 177 is the location where the last exposure will take place.

TABLE 4

Results of direct wafer cooling compared to an unconditioned wafer

|  |  | T-global [mK] | T-global ratio [−] | T-max [mK] | T-max ratio |
|---|---|---|---|---|---|
| unconditioned |  | 494 | 1.00 | 2046 | 1.00 |
| airflow [m^3/hr] | type |  |  |  |  |
| 3 | normal | 334 | 0.68 | 1791 | 0.88 |
| 8 |  | 324 | 0.66 | 1778 | 0.87 |
| 12 |  | 306 | 0.62 | 1755 | 0.86 |
| 30 |  | 264 | 0.53 | 1702 | 0.83 |
| 60 |  | 221 | 0.45 | 1644 | 0.80 |
| 90 |  | 194 | 0.39 | 1606 | 0.78 |
| 120 |  | 176 | 0.36 | 1580 | 0.77 |
| 150 |  | 163 | 0.33 | 1560 | 0.76 |
| 3 | nozzle | 320 | 0.65 | 1761 | 0.86 |
| 6 |  | 300 | 0.61 | 1726 | 0.84 |
| 12 |  | 272 | 0.55 | 1680 | 0.82 |
| 30 |  | 212 | 0.43 | 1582 | 0.77 |
| 60 |  | 152 | 0.31 | 1477 | 0.72 |
| 90 |  | 118 | 0.24 | 1408 | 0.69 |
| 120 |  | 98 | 0.20 | 1365 | 0.67 |
| 150 |  | 86 | 0.17 | 1342 | 0.66 |
| water flow [l/min] |  |  |  |  |  |
| 0.003 | NA | 161 | 0.33 | 947 | 0.46 |
| 0.006 |  | 159 | 0.32 | 944 | 0.46 |
| 0.06 |  | 130 | 0.26 | 904 | 0.44 |
| 0.3 |  | 64 | 0.13 | 797 | 0.39 |
| 0.6 |  | 34 | 0.07 | 729 | 0.36 |
| 3 |  | 8.3 | 0.02 | 515 | 0.25 |
| 6 |  | 5.6 | 0.01 | 408 | 0.20 |

From FIG. 3, attention is drawn to, in particular, the parameters: the wafer temperature at the last exposed die just before exposure, hereinafter referred to as T-global, and the maximum wafer temperature of the last die at the end of exposure, hereinafter referred to as T-max. The values for T-global and T-max and their ratios for the modeled settings, that is normal airflow, nozzle airflow, water flow at various flow rates, for a conditioned wafer are given in Table 4. For means of comparison, T-global and T-max are also given for an unconditioned wafer in Table 4. These results are also shown graphically in FIGS. 4-7.

From these results it is shown that when using air for direct wafer cooling, the global heating can be reduced by a factor of 2 to 3. The decrease of the maximum temperature, T-max is approximately 20%.

Figure 4:
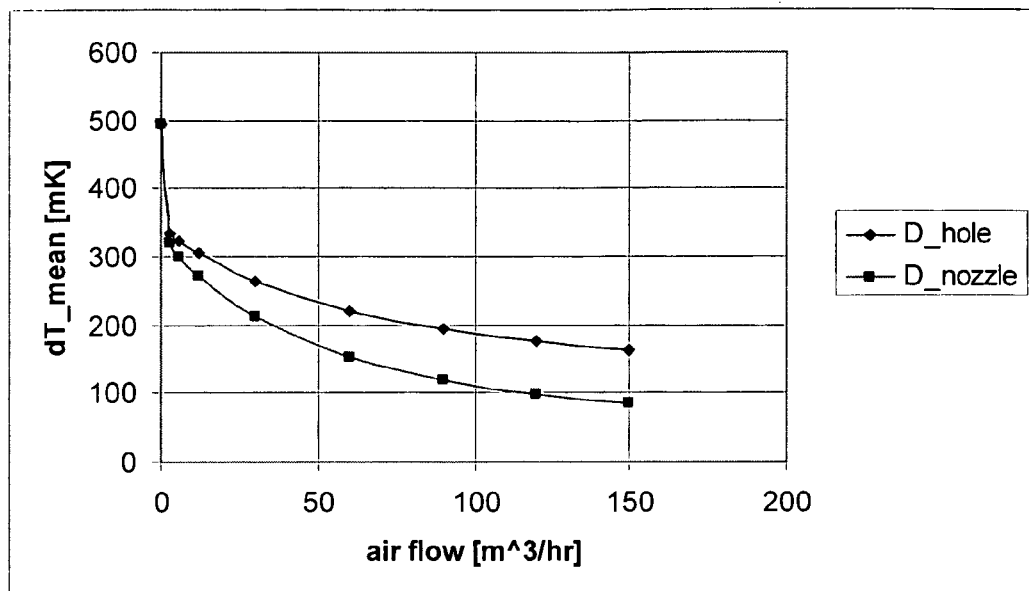
FIG. 4 depicts the effect of air flow on the mean wafer temperature with direct wafer cooling.
Figure 5:
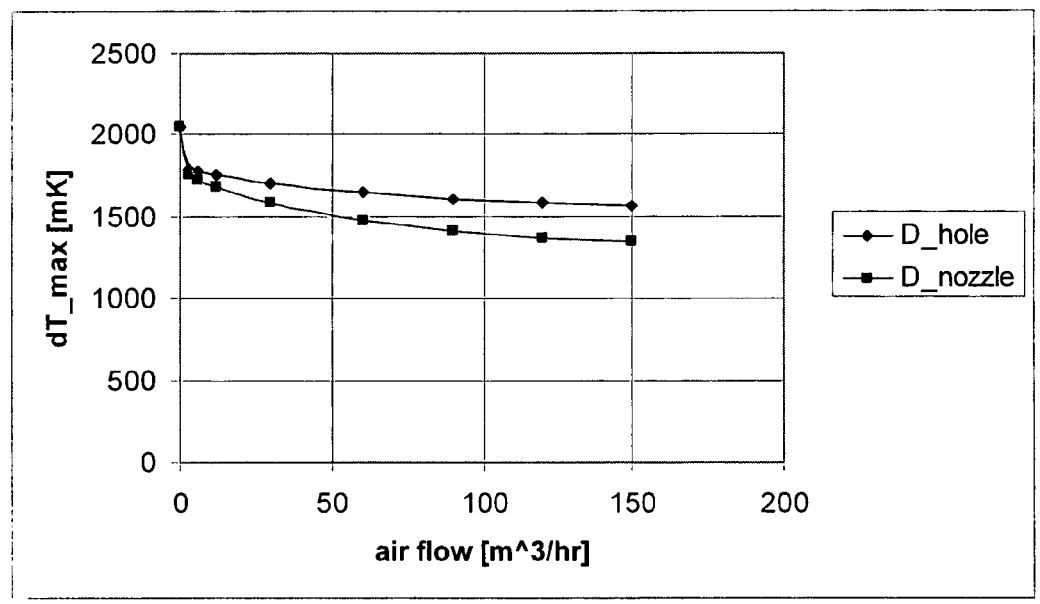
FIG. 5 depicts the effect of air flow on maximum wafer temperature with direct wafer cooling.
Figure 6:
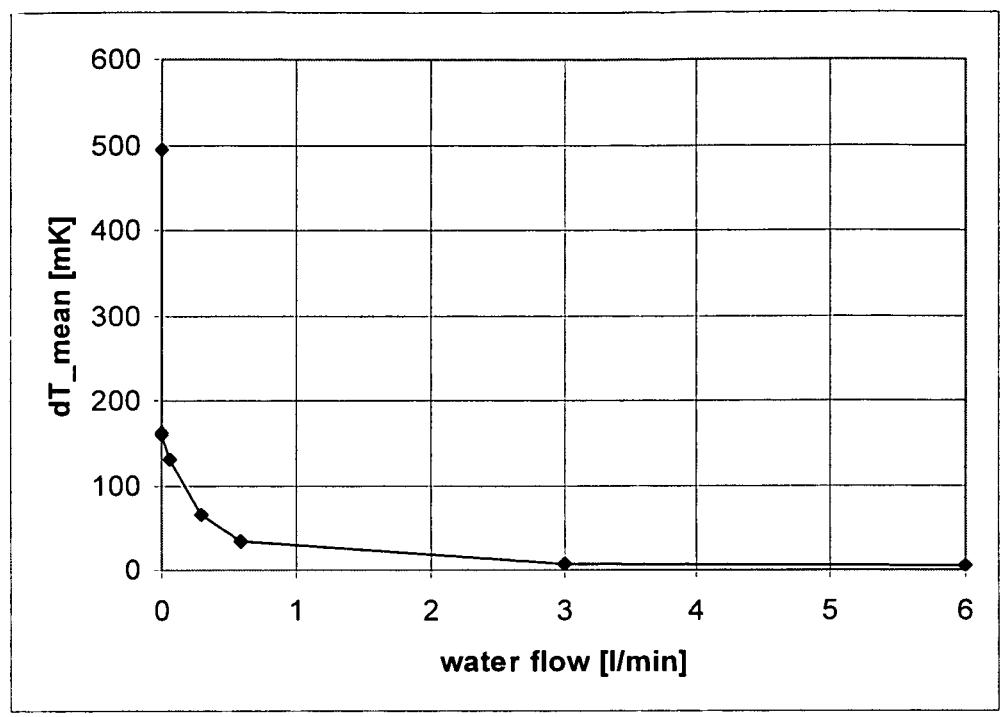
FIG. 6 depicts the effect of water flow on mean wafer temperature with direct wafer cooling.
Figure 7:
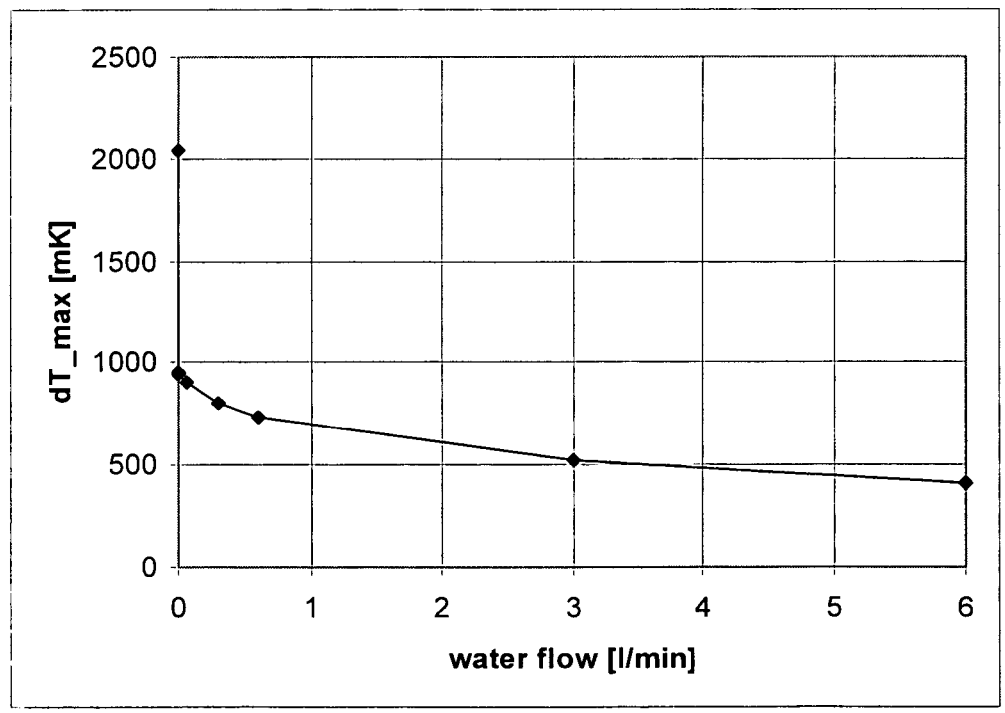
FIG. 7 depicts the effect of water flow on maximum wafer temperature with direct wafer cooling.

When water is used for direct wafer cooling the results are further improved with respect to air cooling. Even for low rate water flows the improvements are significant. The global heating T-global can be reduced by a factor of 4 to 10 for small water flows. The decrease of the maximum wafer temperature T-max is also smaller, by a factor of 2 to 3. In particular, FIG. 4 depicts the effect of air flow on the mean wafer temperature with direct wafer cooling, FIG. 5 depicts the effect of air flow on maximum wafer temperature with direct wafer cooling, FIG. 6 depicts the effect of water flow on mean wafer temperature with direct wafer cooling and FIG. 7 depicts the effect of water flow on maximum wafer temperature with direct wafer cooling. From the results given in Table 4 and depicted in FIGS. 4-7, it is seen that airflows from approximately 3 liters/minute to 150 liters/minute for gases, such as air, provide improved conditioning of the wafer. Further flows for liquids, such as water, from approximately 0.003 liters/minute to approximately 6 liters/minute provide improved wafer conditioning. Within these ranges, any particular flow can be provided depending on each particular circumstance. In particular, it has been found that water flows above approximately 0.06 liters/minute provide particularly beneficial wafer conditioning results.

Figure 8:
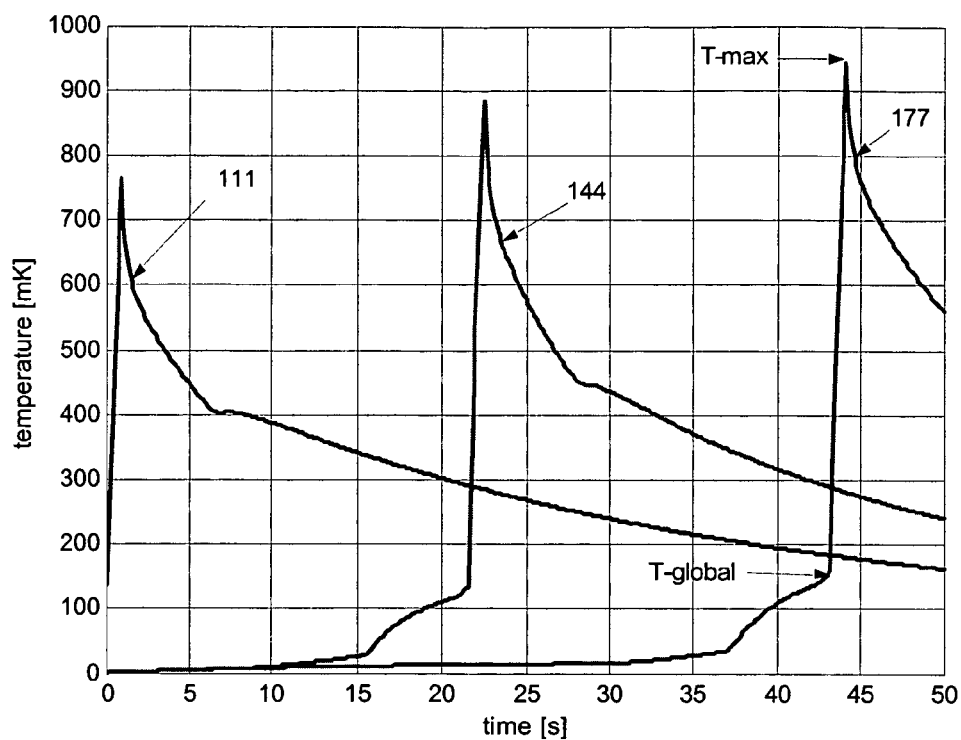
FIG. 8 depicts the wafer temperature behavior at different locations on the wafer, in particular at the first exposed die, the center exposed die and the last exposed die.

Graphs of the temperature behavior at different wafer locations and at the center location of the wafer table WT and mirror block MB for two different water flows are given in FIGS. 8-11. In particular, FIG. 8 depicts the wafer temperature behavior at different locations on the wafer, in particular at the first die 111, the center die 144 and the last die 177. In particular, FIG. 8 shows the temperature changes over time for the three locations. It can be seen that T-max and T-global are significantly improved with respect to the results shown in FIG. 12 depicting an unconditioned wafer. For each exposed location, the temperature over time rises less than for an unconditioned wafer. It has been found that if the temperature rises, in particular, T-max and T-global, can be reduced as shown in FIG. 8, problems associated with wafer heating, such as overlay, are reduced.

Figure 9:
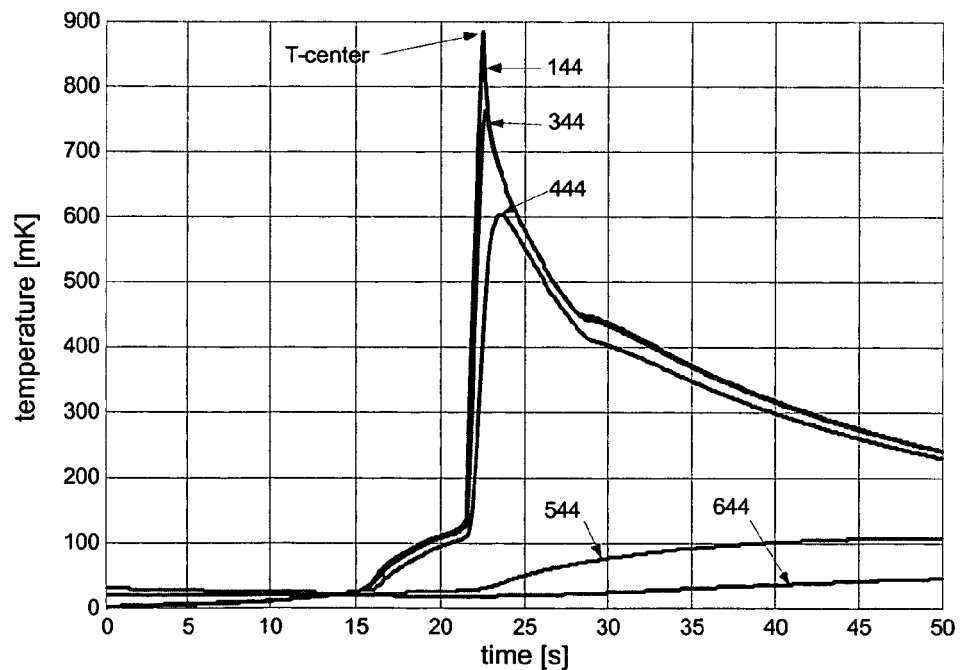
FIG. 9 depicts the temperature behavior at the center of the wafer, the wafer table top, the wafer table bottom, the mirror block top and the mirror block center with a water flow of 0.006 liters per minute.

FIG. 9 depicts the temperature behavior at the center of the wafer 144, the wafer table top 344, the wafer table bottom 444, the mirror block top 544 and the mirror block center 644 with a water flow of 0.006 liters per minute. The temperature rise during exposure of the center of the wafer, that is approximately half way through the exposure of the entire wafer, is shown. If FIG. 9 is compared with the central peak of FIG. 12, it is seen that the maximum temperature reached by the center location of the wafer 144 in the unconditioned wafer, T-center, is significantly higher that for the conditioned wafer shown in FIG. 9. Further, FIG. 9 depicts the significant effect of directly cooling the wafer. Further, FIG. 9 shows that the temperature rises during exposure are far greater for the wafer and wafer table, in particular, the wafer, than for the mirror block MB. Thus, in conventional cooling systems where only the chuck or mirror block are conditioned, it is seen that the conditioning effect is not optimized since the locations in most need of conditioning are not efficiently conditioned, since they are only indirectly conditioned. This is further illustrated in FIG. 11 which depicts a similar graph for a different flow rate.

Figure 10:
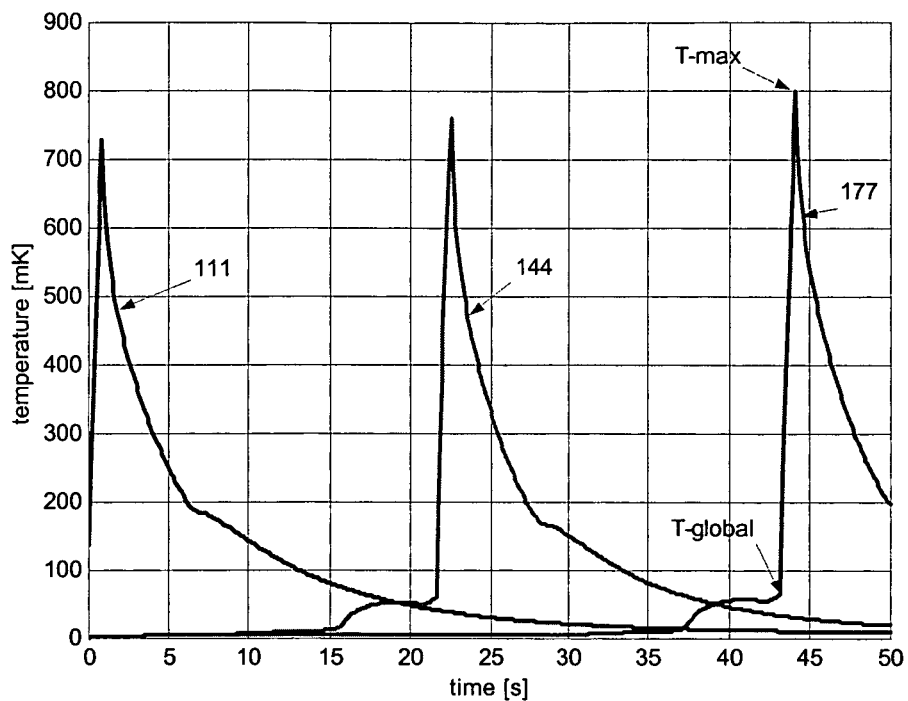
FIG. 10 depicts the wafer temperature behavior at the first exposed die, the center exposed die and the last exposed die with a water flow of 0.3 liters per minute.

FIG. 10 depicts the wafer temperature behavior at the first die 111, the center die 144 and the last die 177 with a water flow of 0.3 liters per minute. In particular, FIG. 10 when compared with FIG. 12, illustrates the vastly improved direct conditioning of the wafer with respect to unconditioned wafers. In particular, T-max and T-global are significantly reduced. It is seen that an embodiment where a flow of a liquid, such as water, at a rate of approximately 3 liters/minute provides greatly improved wafer conditioning. In particular, in terms of the parameters, T-max and T-global.

Figure 11:
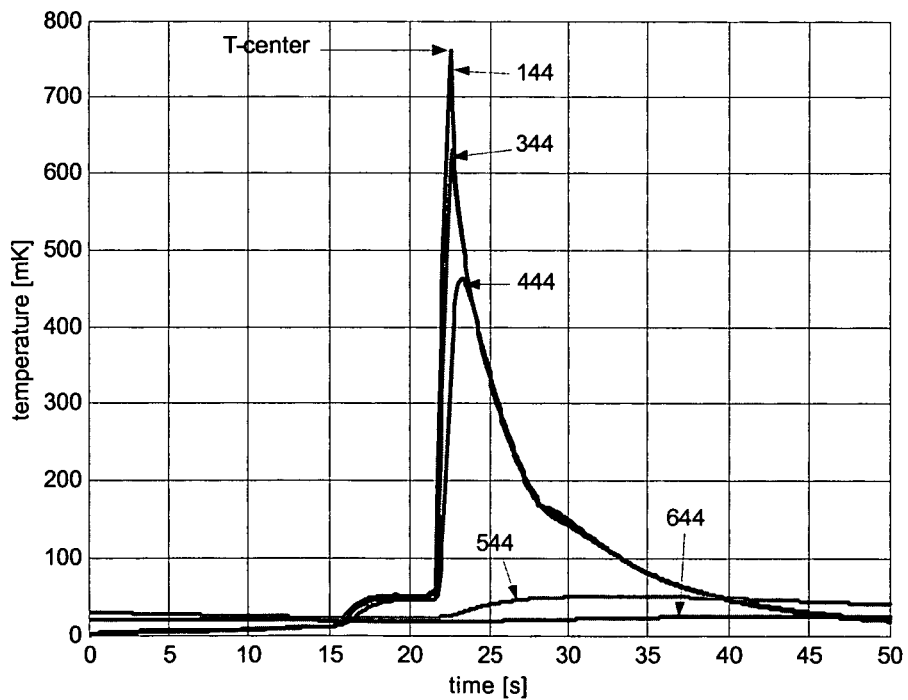
FIG. 11 depicts the temperature behavior at the center of the wafer, the wafer table top, the wafer table bottom, the mirror block top and the mirror block center with a water flow of 0.3 liters per minute.

FIG. 11 depicts the temperature behavior at the center of the wafer 144, the wafer table top 344, the wafer table bottom 444, the mirror block top 544 and the mirror block center 644 with a water flow of 0.3 liters per minute. FIG. 11 is similar to FIG. 9, except that a water flow rate of 0.3 liters per minutes is shown. The observations made with respect to FIG. 9 are equally applicable to FIG. 11.

While specific embodiments of the invention have been described above, it will be appreciated that the invention may be practiced otherwise than as described. The description is not intended to limit the invention.

What is claimed is:

1. A lithographic apparatus, comprising:
    a substrate table configured to hold a substrate during projection of a patterned beam onto a target portion of the substrate; and
    a conditioning system constructed to directly condition a non-target portion of the substrate with a conditioning fluid coming into contact with the substrate being held by the substrate table, wherein the conditioning fluid will have a flow rate between approximately 3 to 150 m$^3$ per hour if gas or a flow rate between approximately 0.003 to 6 liters per minute if liquid,
    wherein a total outlet area formed on an upper surface of the substrate table to remove the conditioning fluid from the substrate is substantially the same as a total inlet area formed on an upper surface of the substrate table to supply conditioning fluid to the substrate.

2. An apparatus according to claim 1, wherein the conditioning fluid is a coolant capable of cooling the substrate.

3. An apparatus according to claim 1, wherein the conditioning system comprises at least one conditioning fluid supply device configured to transport a conditioning fluid to a surface of the substrate.

4. An apparatus according to claim 3, wherein the at least one conditioning fluid supply device comprises at least one hole formed in a surface of the substrate table, and the at least one hole is in fluid connection with a supply of conditioning fluid.

5. An apparatus according to claim 4, wherein the number of holes provided to supply the conditioning fluid is approximately 200 holes/m$^2$ to 113,000 holes/m$^2$ of the substrate table.

6. An apparatus according to claim 4, wherein the number of holes provided to supply the conditioning fluid is approximately 420 holes/m$^2$ to 57,000 holes/m$^2$ of the substrate table.

7. An apparatus according to claim 1, wherein the conditioning system comprises at least one conditioning fluid removal device configured to transport the conditioning fluid away from a surface of the substrate.

8. An apparatus according to claim 7, wherein the at least one conditioning fluid removal device comprises at least one hole formed in a surface of the substrate table that is in fluid connection with a reservoir of conditioning fluid to receive the conditioning fluid.

9. An apparatus according to claim 1, wherein the conditioning fluid is air.

10. An apparatus according to claim 1, wherein the conditioning fluid is water.

11. An apparatus according to claim 4, wherein the hole is a nozzle shaped to increase the heat transfer of the conditioning fluid supplied to the substrate by increasing the flow speed of the conditioning fluid.

12. An apparatus according to claim 1, wherein the substrate table extends substantially in a plane lying at an angle to a direction of propagation of the patterned beam, the substrate is supported by the substrate table substantially in the plane, the substrate having first and second opposing surfaces, the first surface is arranged to receive the beam, and the second surface is arranged to be directly conditioned by the conditioning system.

13. An apparatus according to claim 12, wherein in the direction of propagation of the patterned beam, the second surface is arranged downstream of the first surface.

14. An apparatus according to claim 1, wherein the non-target portion of the substrate comprises an area disposed on a backside of the substrate, the backside being disposed opposite a side of the substrate on which the target portion is located, and, in use, the fluid conditions the backside of the substrate.

15. An apparatus according to claim 1, wherein the conditioning system is configured to condition a backside of the substrate.

16. An apparatus according to claim 1, wherein the conditioning system is a thermal conditioning system.

17. A method of manufacturing a device, comprising:
    projecting a patterned beam of radiation onto a target portion of a substrate;
    holding the substrate with a substrate table during projection of the patterned beam; and
    directly conditioning a non-target portion of the substrate with a conditioning fluid coming into contact with the substrate being held by the substrate table, wherein the conditioning fluid has a flow rate between approximately 3 to 150 m$^3$ per hour if gas or a flow rate between approximately 0.003 to 6 liters per minute if liquid wherein a total outlet area formed on an upper surface of the substrate table to remove the conditioning fluid from the substrate is substantially the same as a total inlet area formed on an upper surface of the substrate table to supply conditioning fluid to the substrate.

18. An apparatus according to claim 1, wherein the non-target portion of the substrate is conditioned by the conditioning system during projection of the patterned beam.

19. A method according to claim 17, wherein the non-target portion of the substrate is conditioned during projection of the patterned beam.

20. A lithographic apparatus, comprising:
    a substrate table configured to hold a substrate during projection of a patterned beam onto a target portion of the substrate; and
    a conditioning system constructed to directly condition a non-target portion of the substrate with a conditioning fluid coming into contact with the substrate being held by the substrate table during projection of the patterned beam, wherein the conditioning system is configured to provide a flow of the conditioning fluid at a vacuum level to hold the substrate.

21. An apparatus according to claim 1, further comprising:
    an illumination system configured to condition a beam of radiation;
    a support configured to support a patterning device, the patterning device configured to impart a cross-section of the beam with a pattern to form the patterned beam; and
    a projection system configured to project the patterned beam onto the target portion of the substrate.

22. An apparatus according to claim 20, further comprising:
- an illumination system configured to condition a beam of radiation;
- a support configured to support a patterning device, the patterning device configured to impart a cross-section of the beam with a pattern to form the patterned beam; and
- a projection system configured to project the patterned beam onto the target portion of the substrate.

23. An apparatus according to claim 1, wherein the conditioning system comprises at least one conditioning fluid supply device configured to transport the conditioning fluid to a surface of the substrate and to control vacuum to the substrate table to hold the substrate.

24. An apparatus according to claim 1, wherein the conditioning system is configured to provide a flow of the conditioning fluid at a vacuum level to hold the substrate.

* * * * *